United States Patent [19]

Takei

[11] Patent Number: 5,706,175
[45] Date of Patent: Jan. 6, 1998

[54] RESIN-SEALED SEMICONDUCTOR DEVICE

[75] Inventor: Shinji Takei, Tokyo, Japan

[73] Assignee: Kabushiki Kaisha Toshiba, Kanagawa-ken, Japan

[21] Appl. No.: 502,642

[22] Filed: Jul. 14, 1995

[30] Foreign Application Priority Data

Oct. 6, 1994 [JP] Japan .................................. 6-242993

[51] Int. Cl.$^6$ ...................................... H05K 1/00
[52] U.S. Cl. ................. 361/760; 361/736; 257/675; 257/676; 357/72; 357/70; 174/52.2; 427/211; 428/76
[58] Field of Search ..................... 361/760, 761, 361/762, 783, 710; 437/215; 427/96; 174/251, 52.2, 52.3; 257/787, 784, 723, 724, 783, 676, 700; 439/66, 91, 591

[56] References Cited

U.S. PATENT DOCUMENTS

| 4,719,502 | 1/1988 | Ikeya et al. | 357/72 |
| 4,814,943 | 3/1989 | Okuaki | 361/400 |
| 5,093,712 | 3/1992 | Matsunaga et al. | 357/72 |
| 5,124,192 | 6/1992 | Kin et al. | 428/215 |
| 5,314,842 | 5/1994 | Sawaya et al. | 437/211 |

FOREIGN PATENT DOCUMENTS

| 1-194446 | 8/1989 | Japan | 257/747 |

*Primary Examiner*—Leo P. Picard
*Assistant Examiner*—David Foster
*Attorney, Agent, or Firm*—Finnegan, Henderson, Farabow, Garrett & Dunner, L.L.P.

[57] ABSTRACT

A resin-sealed semiconductor device includes a plurality of electronic components mounted on a printed wiring board, a circuit mounting surface of the board being resin-sealed, with connection terminals of the electronic components electrically connected to a printed wiring on the board. A surface portion of the board is coated with insulator material which contains tiny hollow spheres and constitutes a thermal expansion resin.

2 Claims, 4 Drawing Sheets

RESIN-SEALED SEMICONDUCTOR DEVICE

BACKGROUND OF THE INVENTION

1. Field of the Invention

The present invention relates to a resin-sealed semiconductor device, in particular to a resin-sealed semiconductor device in which an electronic component such as a semiconductor part is mounted on a printed wiring board, and a part-mounting surface of the board is resin-sealed by transfer molding.

2. Description of the Related Art

In a conventional method of mounting on a printed wiring board an electronic component such as an LSI (Large Scale Integration circuit) or a discrete type semiconductor element, external connection terminals (outer leads) of the electronic components packaged by resin-sealing are bent, solder-plated, and soldered to the printed wiring board.

However, such a mounting method is a barrier to improvement of packaging density, since resin-sealed packages have become large. In recent years, a method has come into use in which, as shown in FIG. 4, a semiconductor chip (pellet) 41 such as an LSI or a discrete type semiconductor element is not resin-sealed, but adhered onto a printed wiring board 40 by an adhesive in an exposed state, and a part-mounting surface of the board is sealed by transfer molding, with the connection terminals of the semiconductor chip, such as bonding pads, connected to wires printed on the board by metal wires such as bonding wires 42.

In this method, the board 40 is clamped by metal molds, and resin 43 is injected into a space (cavity) provided between the metal molds and aligned with a seal portion. At this time, the metal molds contact a board surface in the vicinity of a resin-sealed region on the board 40. The clamping pressure on the metal molds is set to a value greater than an injection pressure of the resin, preventing the resin from flowing from the resin-sealed region. In this case, if the board 40 has a uniform thickness, when clamped by an upper metal mold 51 and a lower metal mold 52 as shown in FIG. 5, no gap is provided between contact surfaces of the board and the upper metal mold 51. Therefore, as mentioned above, the resin 43 does not flow from the resin-sealed region.

Printed wires 44 are usually formed on the surface of the board 40. Inevitably, vertical edges or stepped portions are present between the printed wires 44 and regions intervening between the printed wires, e.g., intervening region 46, of the board. Printed wire formation regions of the board are coated with resist material 45 formed mainly of epoxy resin, but the amount of the resist material 45 applied is not enough to form a layer which has a flat upper surface because of the stepped portions. If the amount of the resist material is enough to fill the step portions between the printed wires, the thickness of the resist material becomes significantly large. Such large thickness needs a thick package, so that the thick package cannot meet the requirement for a thin package.

Due to the stepped portions, a gap 53 is left between the upper metal 51 and the board 40, as shown in FIG. 5, when the board 40 is clamped by the upper metal mold 51 and the lower metal mold 52. The resin inevitably flows out of the resin-sealed region when injected.

FIG. 6 is a diagram showing a relationship between the clamping pressure on metal molds, on the one hand, and the dispersion and average of resin flowing distance (resin projection) of ten samples, on the other hand, which is observed in a conventional resin-sealed semiconductor device. As can be seen from FIG. 6, the resin flowing distance does not depend on the clamping pressure. That is, there is no relationship between the resin flowing distance and the clamping pressure. Thus, the gap between the contact surfaces of the metal mold and the board cannot be filled up, even when the clamping pressure is increased.

As mentioned above, if the resin flows from the resin-sealed region when injected a portion of the resin projecting from the device will remain in the resin-sealed semiconductor device taken out of the metal molds after the resin is hardened.

If the resin projection adheres to another printed wiring board, imperfect connection contrary to a predetermined connection can occur.

SUMMARY OF THE INVENTION

As mentioned above, in a conventional resin-sealed semiconductor device, when resin is injected, with the part-mounting portion of the board clamped by the metal molds, a gap is easily provided between the contact surfaces of the metal mold and the board, and the resin can easily flow from the resin-sealed region. Thus, there is a problem wherein a resin projection is formed, and an imperfect connection occurs.

An object of the present invention is to provide a resin-sealed semiconductor device in which when resin is injected, with a part-mounting surface of a board clamped by formation metal molds, a gap is not substantially provided between contact surfaces of a metal mold and the board, the resin does not substantially flow from a resin-sealed region, a resin projection is not substantially formed, and thus it is possible to prevent imperfect connection which occurs due to adhesion of the resin projection to another printed wiring board.

The present invention provides a resin-sealed semiconductor device including a printed wiring board having a plurality of wirings on an upper surface portion thereof, an electronic component mounted on the board and connected to at least one of the plurality of wirings, an insulator material covering the upper surface portion of the board and containing tiny hollow spheres, and a resin sealing a part-mounting surface of the wiring board.

In accordance with other aspect of the present invention provides a resin-sealed semiconductor device including a printed wiring board having a plurality of wirings on an upper surface portion thereof, a plurality of electronic component mounted on the board and connected to ones of the plurality of wirings, an insulator material covering the upper surface portion of the board and having a substantially flat upper surface, and a resin sealing a part-mounting surface of the board.

In accordance with other aspect of the invention provides a resin-sealed semiconductor device including a printed wiring board having a plurality of wirings on an upper surface portion thereof, an electronic component mounted on the board and connected to at least one of the plurality of wirings, an insulator material covering the upper surface portion of the board and having a substantially flat upper surface and a resin sealing a part-mounting surface of the board.

In accordance with another aspect of the invention provides a method for resin-sealing a semiconductor device including the steps of providing a printed wiring board having a plurality of wirings on an upper surface, an electronic component mounted on the upper surface and connected to at least one of the plurality of wirings, covering the upper surface of the board exclusively the electronic component with an insulator material containing tiny hollow spheres, clamping the board between upper and lower molds to form a resin sealing region, and injecting a resin material into the resin sealing region.

In the resin-sealed semiconductor device of the present invention, since the insulator material includes a predetermined amount of thermal expansion resin, when it is heat-cured after coating, the thermal expansion resin expands, a surface of the insulator material is substantially flattened, and compressibility of the insulator material becomes high such that the insulator material has repulsive elasticity. Therefore, when the board is clamped by the metal molds, the insulator material is deformed, and a gap is not substantially provided between the contact surfaces of the metal mold and the board. Thus, there is substantially no possibility that the resin may flow from the resin-sealed region when injected, and the resin projection is not substantially formed on the resin-sealed semiconductor device taken out of the metal molds after the injected resin is hardened. Therefore, the problem wherein imperfect connection occurs due to adhesion of the resin projection to another printed wiring board does not arise.

BRIEF DESCRIPTION OF THE DRAWINGS

The accompanying drawings, which are incorporated in and constitute a part of the specification are as follows.

DETAILED DESCRIPTION OF THE PREFERRED EMBODIMENTS

Figure 1:
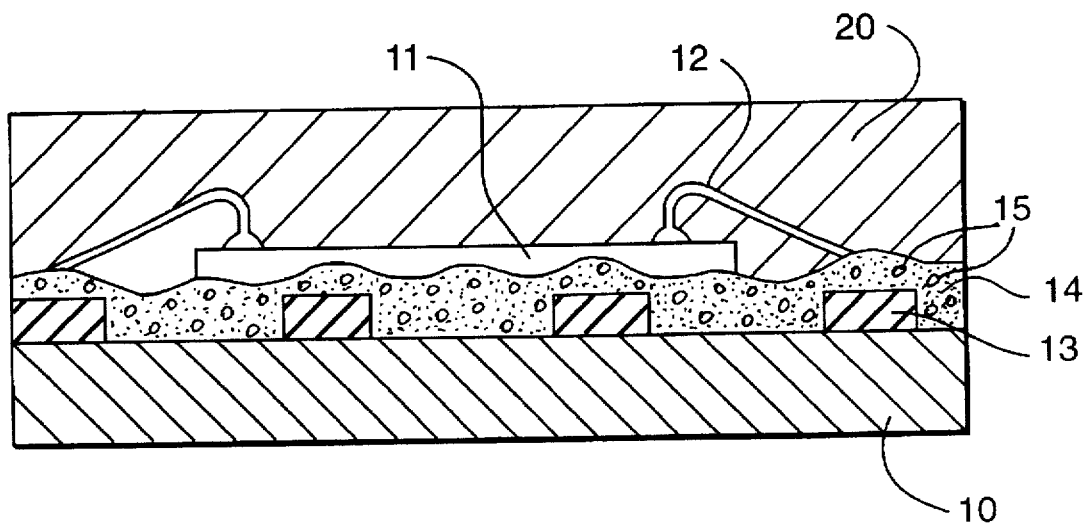
FIG. 1 is a cross-sectional view showing a portion of a resin-sealed semiconductor device relating to a first embodiment of the present invention.

An embodiment of the present invention will be explained with reference to the drawings as follows:

FIG. 1 shows a resin-sealed semiconductor device relating to an embodiment of the present invention. In the resin-sealed semiconductor device shown in FIG. 1, a plurality of electronic components are mounted on a printed wiring board, and a part-mounting surface of the wiring board is resin-sealed. The connection terminals of the electronic components are electrically connected to a wiring on the board.

Further, the resin-sealed semiconductor device is characterized in that a surface portion of the circuit board is coated with an insulator material which contains tiny hollow spheres formed of thermal expansion resin.

In this embodiment, a printed wiring board 10 is used. In order to improve mounting density, a semiconductor chip (pellet) 11 such as an LSI or a discrete type semiconductor element is mounted on the printed wiring board 10 in an exposed state, and adhered thereto, for example, by an adhesive. A part-mounting surface of the printed wiring board is sealed with resin 20 by transfer molding.

Further, printed wire (13) formation regions on the surface of the printed wiring board 10 are coated with resist material 14 formed mainly of epoxy resin, and additionally, tiny hollow spheres 15 are mixed in the resist material 14 in an amount of 3 to 10. The combination of material 14 and spheres 15 constitutes a thermal expansion resin composed of a copolymer of vinylidene chloride or acrylonitrile is used as a core, and isobutane is capsuled in the copolymer and used as a foaming material. Such a thermal expansion resin has been developed by Excelpancel Company in Sweden. A commercial product of Excelpancel which is generally referred to as a mircrosphere or microballoon material has an expansion temperature of 80 to 150, and expands when heated to have a sphere diameter increased from 5 to 30 m to 10 to 100 m.

Polyimide is also able to used as the resist material 14 instead of epoxy resin. The above described electronic components can be as a single electronic component.

Figure 2:
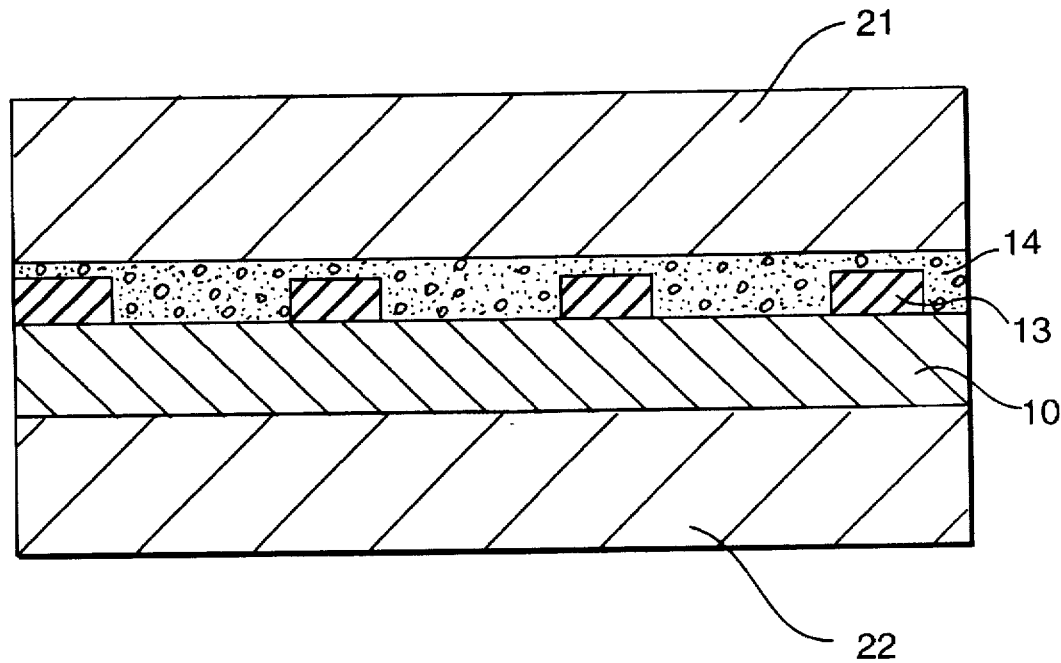
FIG. 2 is a cross-sectional view showing a state wherein in a resin-sealing method of the resin-sealed semiconductor device shown in FIG. 1, a gap is not provided between contact surfaces of a board and a metal mold when the board is clamped by metal molds.

In the case where the semiconductor device shown in FIG. 1 is to be resin-sealed, the part-mounting surface of the printed wiring board 10 is clamped by the metal molds, and resin 20 is injected into a space (cavity) aligned with a seal portion. At this time, if the board 10 is of uniform thickness, when as shown in FIG. 2, the board 10 is clamped by both an upper metal mold 21 and a lower metal mold 22, no gap is provided in the space into which the region is injected between contact surfaces of the upper metal mold 21 and the lower metal mold 22. Therefore, as mentioned above, the resin 20 does not flow from the resin-sealed region not shown in FIG. 2.

Figure 5:
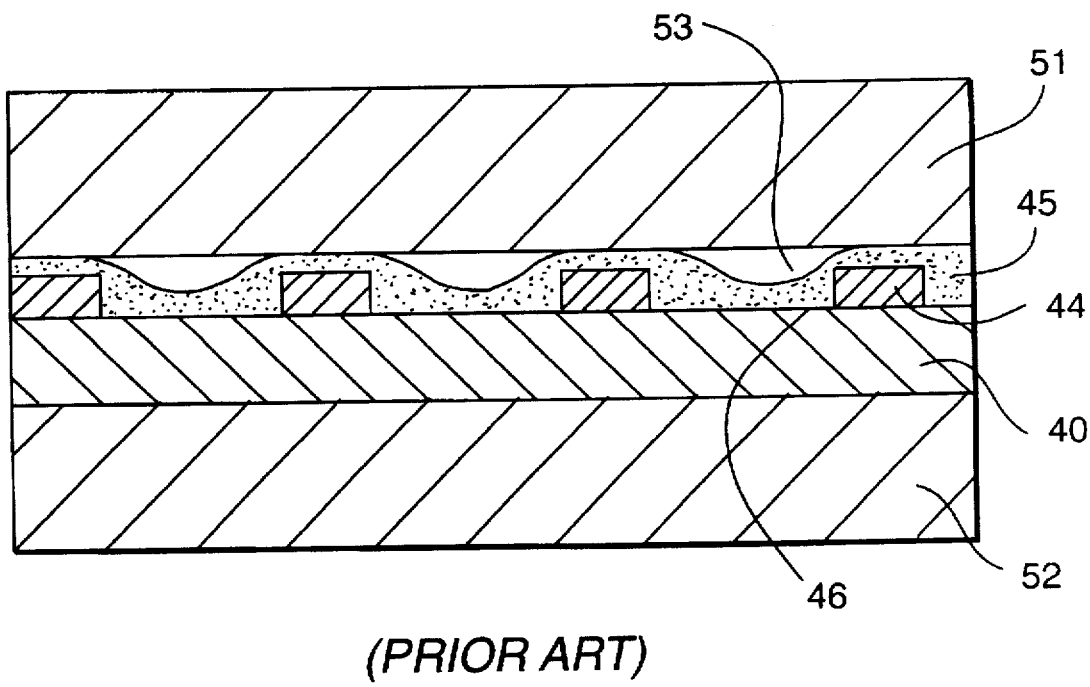
FIG. 5 is a view showing a state of the resin-sealed semiconductor device shown in FIG. 4 in a resin-sealing method.
Figure 6:
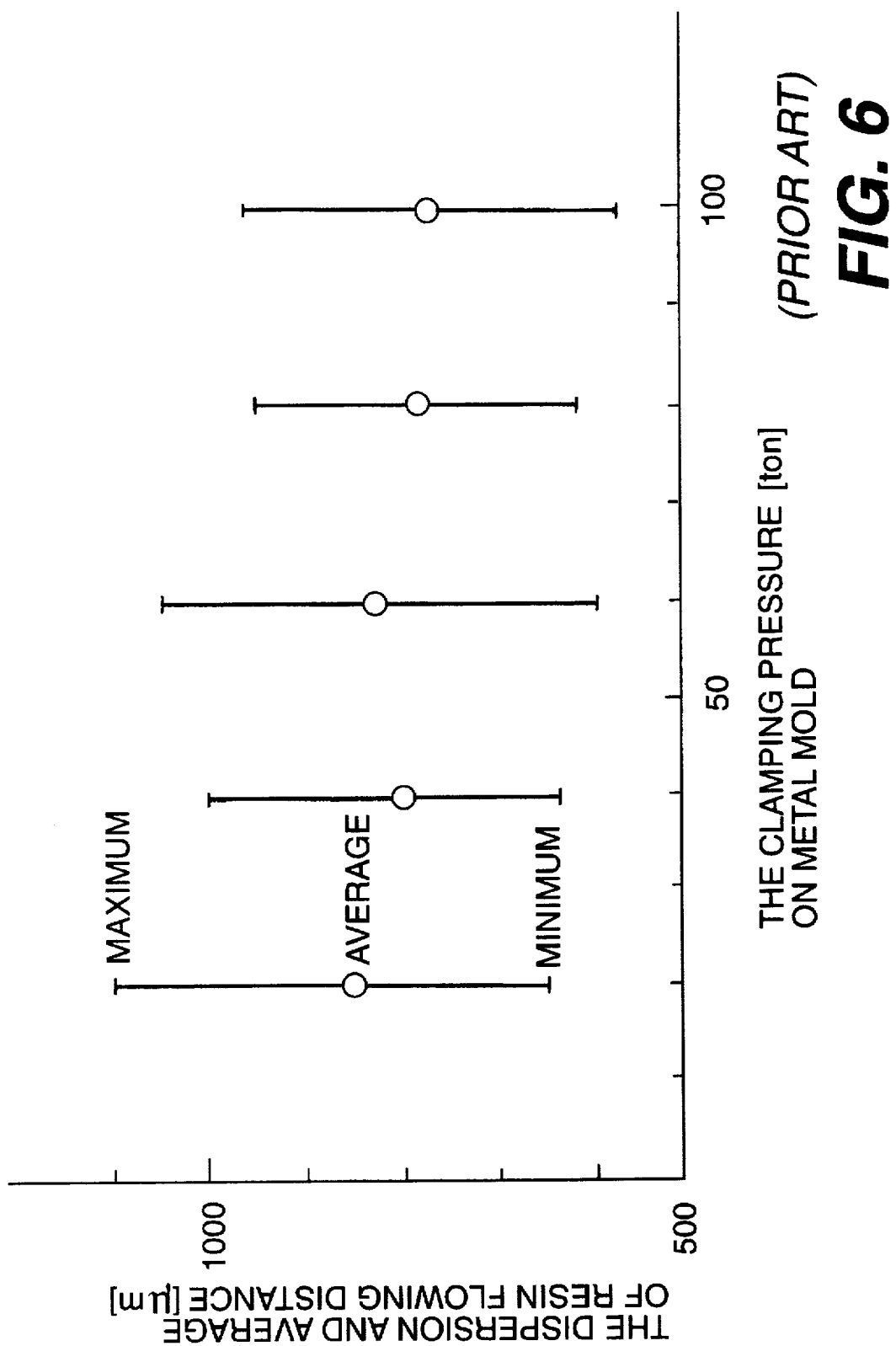
FIG. 6 is a diagram showing a relationship between a clamping pressure on metal molds shown in FIG. 5, on the one hand, and the dispersion and average of resin flowing distance (resin projection) at the time of injecting resin, on the other hand, which is observed in the conventional resin-sealed semiconductor device.

However, since the printed wires 13 are formed on the surface of the board 10, if stepped portions are present between printed wire portions and printed wire intervening portions of the board, a gap is provided between the contact surfaces of the metal mold and the board, and thus, the resin flows from the resin-sealed region when it is injected. In order to prevent this, the printed wire formation regions are coated with the above-mentioned resist material 14 for insulation by screen printing. In this case, when the resist material 14 is heat-cured after screen printing of the resist material 14, the thermal expansion resin 15 contained in the resist material 14 expands. As a result, the surface of the resist material 14 is substantially smoother than the surface of resist material in a conventional device, such as illustrated in FIG. 5, and is substantially flattened as shown in FIG. 1, and a layer having a substantially flat upper surface is substantially formed despite the stepped portions between the printed wire portions and the printed wire intervening portions.

Further, compressibility of the resist material 14 becomes high such that the resist material 14 has repulsive elasticity. When the board 10 is clamped by the upper metal mold 21 and the lower metal mold 22, the surface of the resist material 14 is deformed to be flattened, and a space is not substantially provided between the contact surfaces of the upper metal mold 21 and the board. Therefore, during the injecting step, there is substantially no possibility that the resin 20 may flow from the resin-sealed region as mentioned above, and a resin projection is not substantially formed in the resin-sealed semiconductor device taken out of the metal molds after the injected resin 20 is hardened.

Thus, the problem wherein imperfect connection occurs due to adhesion of the resin projection to another circuit board does not arise.

Figure 3:
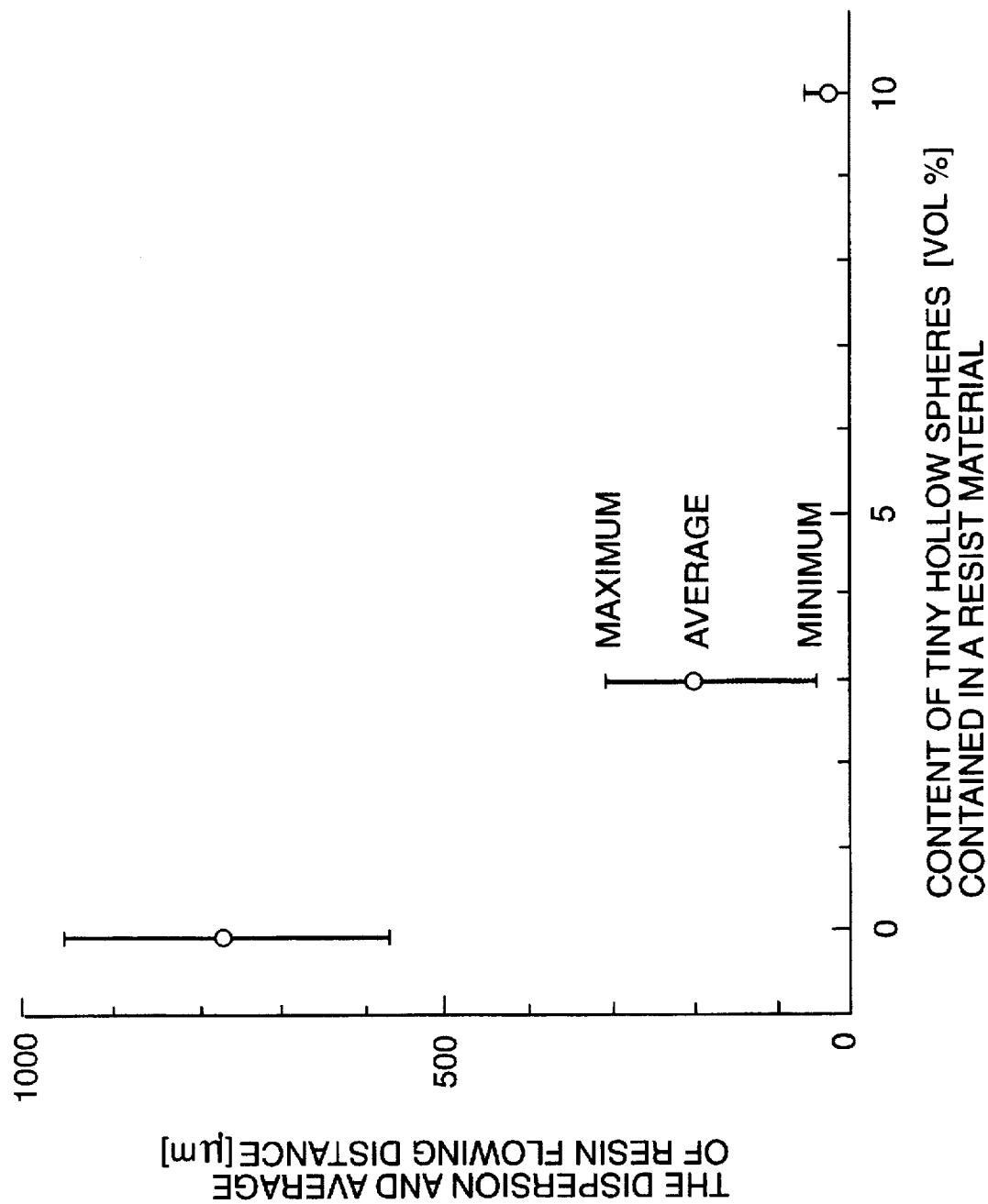
FIG. 3 is a diagram showing a relationship between content of tiny hollow spheres contained in a resist material, on the one hand, and the dispersion and average value of resin flowing distance (resin projection), on the other hand, the relationship being established when the resin-sealed semiconductor device shown in FIG. 1 is transfer-molded.
Figure 4:
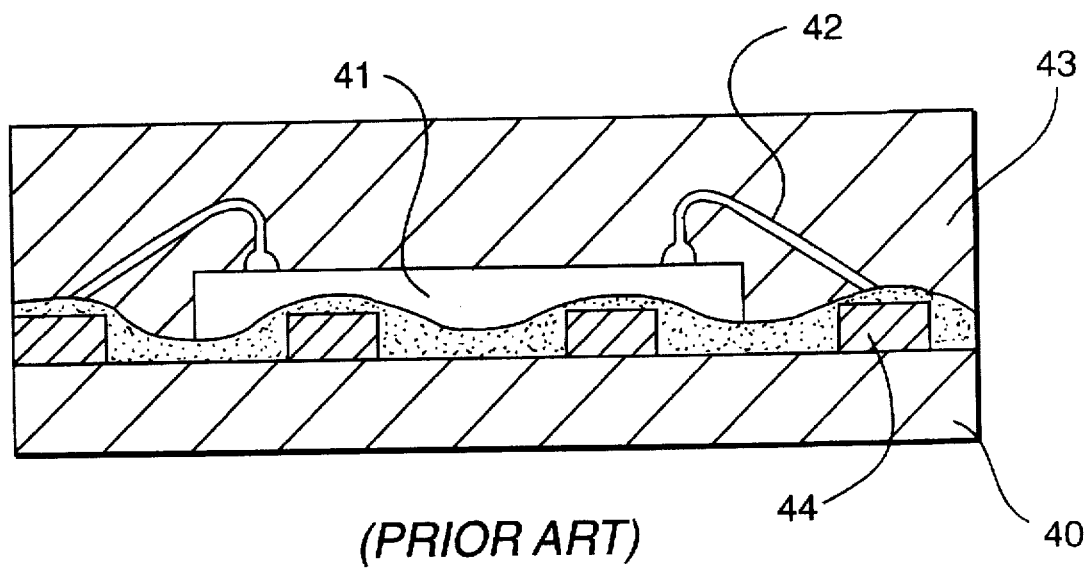
FIG. 4 is a cross-sectional view showing a portion of a conventional resin-sealed semiconductor device.

FIG. 3 illustrates a relationship between content of the tiny hollow spheres 15 contained in the resist material 14, on the one hand, and the dispersion and average of resin flowing distance (resin projection), on the other hand, the relationship being established when the resin-sealed semiconductor device shown in FIG. 1 is transfer-molded. Further, the following are conditions at the time of molding: a metal mold temperature is 175° C. a clamping pressure on the metal molds is 200 kg/cm2, and a resin injection pressure is 1000 kg/cm2. Further, the number of measurement samples of the resin projections is 10. The maximum flowing distance of each of the measurement samples is measured, and its maximum and minimum values and an average value of the ten samples are shown. As can be seen from FIG. 3, when the content of the tiny hollow spheres 15 contained in the resist material 14 is set at 10%, the resin projection is restricted to 50 μm or less, and when the content of the tiny hollow spheres 15 is set at 3 to 10%, the resin projection is restricted to 300 μm or less.

Additionally the tiny hollow spheres 15 can be included in the resin 20. In such case, resin 20 can be more precisely formed to a predetermined shape.

Also, using the hollow spheres 15 in the resin 20, there are no unnecessary connection between neighboring terminals provided on a semiconductor chip.

As mentioned above, according to the resin-sealed semiconductor device, in the case where resin is injected, with the part-mounting surface of the board clamped by metal molds, a gap is not substantially provided between the contact surfaces of the metal mold and the board, the resin does not substantially flow from the resin-sealed region, and resin projections are substantially not formed.

Therefore, it is possible to prevent an imperfect connection which occurs due to adhesion of the resin projection to another printed wiring board.

Numerous modifications and variations of the present invention are possible in light of the teachings. It is therefore to be understood that, within the scope of the appended claims, the present invention can be practiced in a manner other than as specifically described herein.

What is claimed is:

1. A resin sealed semiconductor device comprising:

a printed wiring board having a plurality of wirings on an upper surface portion thereof;

an electronic component mounted on the board and connected to at least one of the plurality of wirings;

an insulator material covering the upper surface portion of the board and containing tiny hollow spheres, wherein the insulator material is a resist material formed mainly of an epoxy resin and the insulator coats a printed wire region of the upper surface portion of the board, and wherein the resist material is a thermal expansion resin formed of copolymer of vinylidene chloride or acrylonitrile used as a core and isobutane capsuled as the spheres in the copolymer and used as a foaming agent, the resist material expanding when heated at a temperature of 80 to 150° C. to have a sphere diameter increased from 5 to 30 μm to 10 to 100 μm, and the tiny hollow spheres are mixed in the resist material in an amount of 3 to 10%; and a resin sealing a part-mounting surface of the wiring board.

2. A resin-sealed semiconductor device according to claim 1, wherein a plurality of electronic components are adhered onto the board in an exposed state, and the semiconductor device further includes resin-sealed LSI chips having terminals connected by metal wires to the plurality of wirings on the board.

* * * * *